(12) United States Patent
Yu

(10) Patent No.: US 11,742,695 B2
(45) Date of Patent: Aug. 29, 2023

(54) EMERGENCY SHED

(71) Applicant: Ledup Manufacturing Group Limited, Irwindale, CA (US)

(72) Inventor: Jing Jing Yu, Irwindale, CA (US)

(73) Assignee: Ledup Manufacturing Group Limited, Irwindale, CA (US)

( * ) Notice: Subject to any disclaimer, the term of this patent is extended or adjusted under 35 U.S.C. 154(b) by 0 days.

(21) Appl. No.: 17/836,876

(22) Filed: Jun. 9, 2022

(65) Prior Publication Data

US 2022/0399749 A1 Dec. 15, 2022

Related U.S. Application Data

(60) Provisional application No. 63/209,129, filed on Jun. 10, 2021.

(51) Int. Cl.
| | |
|---|---|
| H02J 9/06 | (2006.01) |
| H02J 3/32 | (2006.01) |
| H02J 7/00 | (2006.01) |
| H02J 3/00 | (2006.01) |
| H01M 10/46 | (2006.01) |
| H01M 10/42 | (2006.01) |
| H01M 10/44 | (2006.01) |
| C02F 1/00 | (2023.01) |
| C02F 1/44 | (2023.01) |
| H02J 7/35 | (2006.01) |

(Continued)

(52) U.S. Cl.
CPC .............. *H02J 9/062* (2013.01); *B60L 55/00* (2019.02); *C02F 1/001* (2013.01); *C02F 1/441* (2013.01); *C02F 1/76* (2013.01); *G01R 22/06* (2013.01); *H01M 10/4257* (2013.01); *H01M 10/441* (2013.01); *H01M 10/465* (2013.01); *H02J 3/007* (2020.01); *H02J 3/322* (2020.01); *H02J 7/0013* (2013.01); *H02J 7/0048* (2020.01); *H02J 7/00712* (2020.01); *H02J 7/35* (2013.01); *C02F 2201/009* (2013.01); *H01M 2010/4271* (2013.01); *H02J 2207/20* (2020.01); *H02J 2300/24* (2020.01)

(58) Field of Classification Search
CPC .......... H02J 9/062; H02J 3/322; H02J 7/0048; H02J 3/007; H02J 7/00712; H02J 7/0013; H02J 7/35; H02J 2207/20; H02J 2300/24; H02J 9/06; H02J 3/32; H02J 7/00; H02J 3/00; B60L 55/00; C02F 1/001; C02F 1/441; C02F 1/76; C02F 2201/009; C02F 1/00; C02F 1/44; G01R 22/06; H01M 10/4257; H01M 10/441; H01M 10/465; H01M 2010/4271; H01M 10/46; H01M 10/42; H01M 10/44

See application file for complete search history.

(56) References Cited

U.S. PATENT DOCUMENTS

2020/0031238 A1* 1/2020 Kydd .................... H02J 9/062

\* cited by examiner

*Primary Examiner* — Robert L Deberadinis
(74) *Attorney, Agent, or Firm* — Cochran Freund & Young LLC; William W. Cochran

(57) ABSTRACT

Disclosed is an all-in-one emergency shed that can supply electricity and potable drinkable water during an emergency when electrical grid power is not available and water sources may be contaminated. The emergency shed can use battery banks from electric cars to store electrical energy for emergencies and can store electrical energy in electric car battery banks that are charged during off-peak times and resold to the utility company during peak demand periods.

12 Claims, 7 Drawing Sheets

(51) Int. Cl.
*B60L 55/00* (2019.01)
*G01R 22/06* (2006.01)
*C02F 1/76* (2023.01)

EMERGENCY SHED

CROSS-REFERENCE TO RELATED APPLICATION

This Non-Provisional patent application claims the benefit of the U.S. Provisional Patent Application No. 63/209,129, entitled "Emergency Shed", which was filed with the U.S. Patent & Trademark Office on Jun. 10, 2021 and is specifically incorporated herein by reference for all that it discloses and teaches.

BACKGROUND

Natural disasters and emergencies have plagued many areas of the country. For example, floods, hurricanes and tornados have caused an interruption in electric power and other utilities. Some of these natural disasters have contaminated water supplies, which can lead to the spread of various diseases. In colder climates, the loss of power can result in loss of heat and freezing pipes, which can do extensive damage to a house or other building. In some cases, domestic rioting has caused the loss of power. Further, terrorist attacks can also result in a loss of power and the resulting problems.

SUMMARY

An embodiment of the present invention may therefore comprise a method of providing electrical power using an emergency shed comprising: connecting an AC electrical system of the emergency shed to an electrical grid that supplies electrical grid power to the electrical system of the emergency shed; connecting at least one electric car, having at least one electric car battery bank, to a DC electrical system of the emergency shed; connecting a shed battery bank to the DC electrical system of the emergency shed; collecting solar energy with solar cells mounted on the emergency shed to create solar cell electrical power; applying the solar cell electrical power to a controller that generates one or more voltage levels from the solar cell electrical power; applying a first voltage level, of the one or more voltage levels, to the shed battery bank to charge the shed battery bank; applying a second voltage, of the one or more voltage levels, to the at least one electric car battery bank to charge the at least one electric car battery bank; determining if electrical power should be supplied to the electrical grid from the emergency shed; connecting the shed battery bank to the DC electrical system if electrical power from the shed battery bank is to be applied to the electrical grid; connecting the at least one electric car battery bank to the electrical grid if electrical power from the at least one electric car battery bank is to be applied to the electrical grid; connecting an inverter to the DC electrical system when electrical power from the DC electrical system is to be supplied to the electrical grid; inverting DC electrical power from the DC electrical system to AC electrical power using the inverter; connecting the AC electrical system to a grid supply meter to detect an amount of AC electrical power that is supplied to the electrical grid from the emergency shed.

An embodiment of the present invention may further comprise an emergency shed for supplying electricity and potable drinking water during emergencies and for supplying electrical power to the electrical grid during peak demand periods comprising: solar cells mounted on the emergency shed that supply solar energy as DC electrical power; a controller connected to the solar cells that generates at least two DC voltages; a DC electrical system disposed in the emergency shed; a shed battery bank connected to the DC electrical system so that a first DC voltage, of the at least two DC voltages, from the controller charges the shed battery bank; at least one electric car battery bank connected to the DC electrical system and to the controller so that a second DC voltage, of the at least two DC voltages from the controller, charges the electric car battery bank; an AC electrical system disposed in the emergency shed that is connected to the electrical grid; a switch box connected to the AC electrical system and the electrical grid that disconnects the AC electrical system from the electrical grid when power is not present on the electrical grid; an inverter connected to the DC electrical system that supplies AC electrical power from the DC electrical system to the AC electrical system; a house connector that connects the AC electrical system to a house or other building proximate to the emergency shed; a grid supply meter connected to the AC electrical system and to the electrical grid that detects an amount of AC electrical power applied to the electrical grid from the AC electrical system; a charger connected to the AC electrical system that charges the shed battery bank and the at least one electric car battery bank in response to a charger control signal; an AC generator that is connected to the AC electrical system that generates AC power on the AC electrical system in response to an AC generator control signal; a water treatment system that treats a source of water to produce potable drinking water; a first plurality of switches that connects and disconnects the shed battery bank, the at least one electric car battery bank and the inverter to the DC electrical system in response to first switch control signals; a second plurality of switches that connects and disconnects the charger, the grid supply meter and the house connector to the AC electrical system in response to second switch control signals; a computer system that generates the charger control signal, the AC generator control signal, the first switch signals and the second switch control signals to control operation of the emergency shed to supply electricity and potable drinking water during emergencies and supply electricity to the electrical grid during non-emergencies and peak demand periods.

DETAILED DESCRIPTION OF THE EMBODIMENTS

Figure 1:
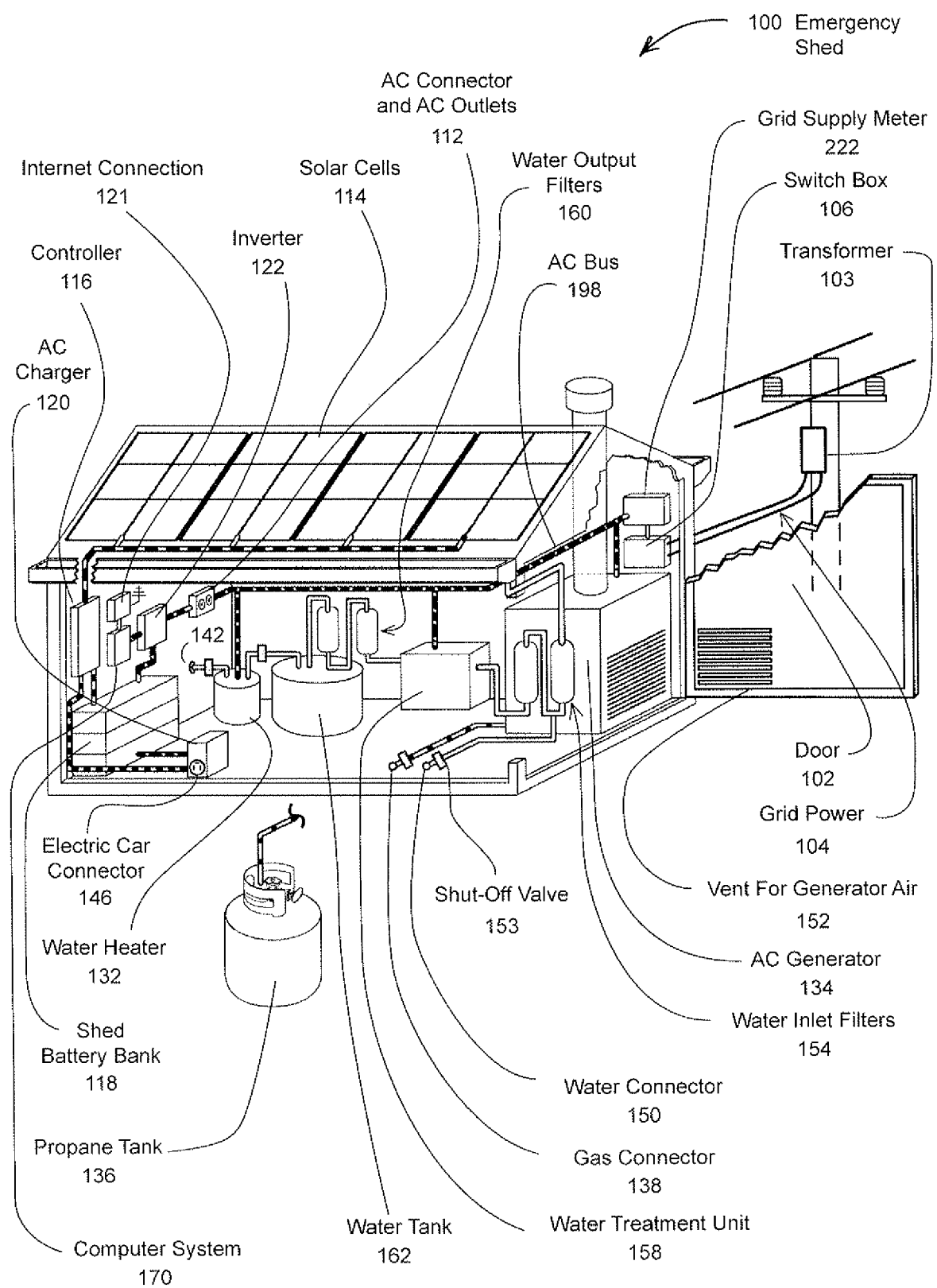
FIG. 1 is a schematic diagram of an embodiment of an emergency shed.

FIG. 1 is a schematic diagram of an embodiment of an emergency shed 100. The emergency shed 100 is a shed that can be sold through standard building supply stores and can be sold as a fully assembled shed or can be sold to homeowners, business owners, ranchers or farmers, etc. for construction. The purchaser of the emergency shed 100 can select from a number of different packages that include various portions of the items illustrated in FIG. 1. For example, a basic package may just contain basic elements illustrated in FIG. 1, while a deluxe package may contain additional items, and a premium package may contain all of the elements illustrated in FIG. 1.

Once the emergency shed 100 has been purchased, either fully constructed by the seller, or constructed by the owner, it is connected to the grid power 104, and an underground water supply or an above-ground water supply can be connected via water connector 150. Also, a gutter system that collects rain from the roof of the emergency shed 100 can supply water. In addition, an external propane tank 136 or a natural gas supply may also be connected to the emergency shed 100.

The emergency shed 100 is designed to provide electrical power and clean water during an emergency. Electricity and clean water can be very valuable commodities during an emergency. Various methods and structures are disclosed herein for supplying off-grid emergency electrical power and clean water.

As illustrated in FIG. 1, the emergency shed 100 includes a door 102 to access the interior portion of the emergency shed 100. The emergency shed 100 is connected to grid power 104 via transformer 103 that is connected to power lines. Grid power 104 is then connected to a switch box 106 mounted in the emergency shed 100. Switch box 106 detects when electrical grid power drops to a level below a selected threshold and isolates the electrical power system of the emergency shed 100 from the grid power 104. Switch box 106 is necessary to ensure that power is not being supplied to the electrical grid during an outage, which may electrocute a line worker or people exposed to power lines when the power to the power lines is intentionally turned off to prevent electrocutions. AC bus 198 connects to an AC connector 112, which provides AC power to a proximate house or other building and to the emergency shed 100 and shed equipment. The AC connector 112 may have a plug connection on the outside of the emergency shed 100 so that a cable can be run from the emergency shed 100 to the house or other building to provide power to the house or other building located proximate to the emergency shed 100. Alternatively, the AC connector 112 can be hardwired to the house at the breaker box of the house. For new house construction, house plugins can be provided on the exterior of the house so that a cable can be used between the house and the emergency shed 100 to provide electric power from the emergency shed 100 to the house.

As also shown in FIG. 1, solar cells 114 are mounted on the roof of the emergency shed 100 and collect solar energy. The electrical power from the solar cells 114 is supplied to a controller 116 that controls the voltage level of the DC power that is applied to the shed battery bank 118. The voltage level applied to the shed battery bank 118, for a plurality of 12 volt batteries, is about 14.3 volts to ensure proper charging of the shed battery bank 118. In that regard, an electric car connector 146 can be mounted in the wall of the emergency shed 100 to allow a user to plug an electric car into the emergency shed 100 to obtain a quick charge of the electric car. In that case, the electric car can be charged from the shed battery bank 118 to reduce the cost of charging an electric car from the electrical grid. In addition, charging the electric car from the battery bank 118 constitutes a more environmentally friendly process since the shed battery bank 118, in most instances, will have been charged from the solar cells 114 or charged during off-peak demand periods using AC charger 120. Electric car charging cables can be made sufficiently long to allow charging of the electric car inside of the house's garage.

By plugging the electric car into the electric car connector 146, battery storage capabilities of the emergency shed 100 are greatly increased. In other words, the electric car battery banks 180, 182 (FIG. 2) can constitute a major portion of the storage capabilities of the emergency shed 100. Also, additional electric car connectors 146 can be used to plug in additional electric cars. The battery storage then increases the amount of battery storage of the emergency shed 100 far beyond the storage amount of the shed battery bank 118. The use of the electric car battery banks 180, 182 (FIG. 2) increases the effectiveness of the emergency shed 100 and allows for a quicker return on investment (ROI) without adding to the initial cost of the emergency shed 100.

As disclosed in more detail below with regard to FIGS. 4 and 5, the battery storage of the shed battery bank 118 and the electric car battery banks 180, 182 (FIG. 2) can be used to supply power back to the electrical grid during peak demand. Many times, especially during the summer season, the electrical grid becomes overloaded, and users experience what is referred to as a brownout. When demand is greater than supply, the voltage on the electrical grid goes low, resulting in a brownout. At other times, there is an excess of power on the electrical grid that is not used. This typically occurs at night and during the very early morning hours. As such, the utilities charge a very large fee for purchasing electric power during peak demand periods and charge a very low fee for electric power during off-peak, low demand periods. Many municipalities have agreed to purchase power back from users, including homeowners, business owners, commercial buildings, etc., especially during peak demand periods. As such, a homeowner that has collected and stored solar energy in the shed battery bank 118 and/or in the electric car battery banks 180, 182, may wish to sell that energy to the municipality to reduce that user's utility bill. A user can select to supply energy from the shed battery bank 118, from the electric car battery banks 180, 182, from an AC generator 134 and directly from its solar cells 114, either singly or any combination of these items. This is explained in more detail below with respect to FIG. 2. As further illustrated in FIG. 1, an AC charger 120 is connected to the AC bus 198 and charges the shed battery bank 118 and electric car battery banks 180, 182 (FIG. 2) from the AC bus 198.

As also illustrated in FIG. 1, a water heater 132 can be powered by 12 volt DC power, by AC electric power, or by natural gas or propane gas. Propane tank 136 can supply propane gas via gas connector 138 to the water heater 132. AC electrical power can be supplied by AC bus 198. Natural gas can be supplied by gas connector 138. A hot water outlet 142 is connected to an exterior wall of the emergency shed 100 to allow for an outside shower and sink. Alternatively, a shower stall and sink can be provided inside the emergency shed 100. A propane tank 136 can be an existing propane tank on the property or an external propane tank that can be purchased and connected to an external connection on the emergency shed 100 to supply propane to the various devices in the emergency shed 100. The propane tank 136 is connected to the water heater 132, as well as the AC generator 134 that is capable of generating AC electrical energy. The AC electrical energy generated by the AC generator 134 is controlled by computer system 170, which determines whether generated electrical power from the AC generator 134 is needed. Computer system 170 is connected to the Internet. The computer system 170 can control the operation of the AC generator 134 to supply electrical power to the AC bus 198. AC generator 134 can either run on propane gas or natural gas depending upon the installation of the AC generator 134.

In certain circumstances, it is desirable to use the AC generator 134 to supply AC power to the electrical system of the emergency shed 100. For example, if it is cloudy or at night, solar cells 114 cannot generate solar electric power. The AC generator 134 can then be used to charge the shed battery hank 118, as well as the electric car battery banks 180, 182 to ensure that the user has sufficiently charged battery storage, especially during emergencies.

As indicated above, a propane connection can be provided at gas connector 138 on the exterior of the emergency shed 100 so that an external propane tank 136 can be connected to the emergency shed 100. For example, a standard connector, such as a connector used for gas barbeque grills can be placed on the exterior portion of the emergency shed 100 and connected to various devices in the emergency shed 100 via a propane line. These devices may include the AC generator 134, the water heater 132 or other devices that need propane gas. If the emergency shed 100 is being used in an area where a propane tank already exists, a simple exterior connection of a propane line to the exterior wall of the emergency shed 100 will allow the existing propane tank to be connected.

Computer system 170 controls the operation of various devices in the emergency shed 100. The computer system 170 may include preprogrammed operations that function in accordance with the flow diagrams illustrated in FIGS. 3, 4, 5, 6 and 7. Computer system 170 is connected to the Internet through a Wi-Fi connection or a local network connection. For example, a user may control the computer system 170 through an app on a smart phone that is connected via the Internet.

FIG. 1 also illustrates the manner in which the emergency shed 100 can supply a source of clean water from a municipal water connection, a well, or from rainwater collected from the roof of emergency shed 100. Water is a very valuable commodity during an emergency. Many times, during an emergency situation, such as flooding and other emergencies, the municipal water supply and well water can be contaminated. In those cases, the water system of the emergency shed 100 can be utilized to provide clean water. Water connector 150 is provided, which may be a connection on the outside of the emergency shed 100 that supplies water to the emergency shed 100, such as by a water truck or other supply. Rainwater from the roof of the emergency shed 100 can be supplied to the water system of the emergency shed 100. Any desired source of water can be supplied through water connector 150. A water pump (not shown) can supply water under pressure to flow through the various devices, such as the filters and water treatment unit. Valves, such as shut-off valve 153, can control the supply of water to the water system of the emergency shed 100. Water inlet filters 154 are used to filter the inlet water prior to entering the water treatment unit 158. Water inlet filters 154 can comprise whole house filters, which may comprise a coarse filter for filtering particulates and a very fine filter that is capable of filtering out spores and other contaminates. For example, one micron or half micron filters can be used, as well as filters that filter heavy metal contaminates and other pollutants. The water then flows to the water treatment unit 158. The water treatment unit 158 may use various types of water treatment processes. One simple and inexpensive method of treating water is to use a chlorine drip system that regulates the amount of chlorine applied to water entering the water treatment unit 158. For example, the chlorine drip system utilizes a supply of liquid chlorine that is dripped into the water entering the water treatment unit 158 based upon the rate of flow of water into the water treatment unit 158. After the water leaves the water treatment unit 158, it passes through water output filters 160. Water output filters 160 can be used to remove heavy metal contaminates, particulates and a carbon filter can be used to remove chlorine from the water. The water is then sent to water tank 162, where it is stored. Water heater 132 provides an additional water storage area. A hot water outlet 142 can be mounted in the wall of the emergency shed 100 to provide for an outdoor shower and/or sink, or the hot water can be hooked to an inside shower and/or sink.

Figure 2:
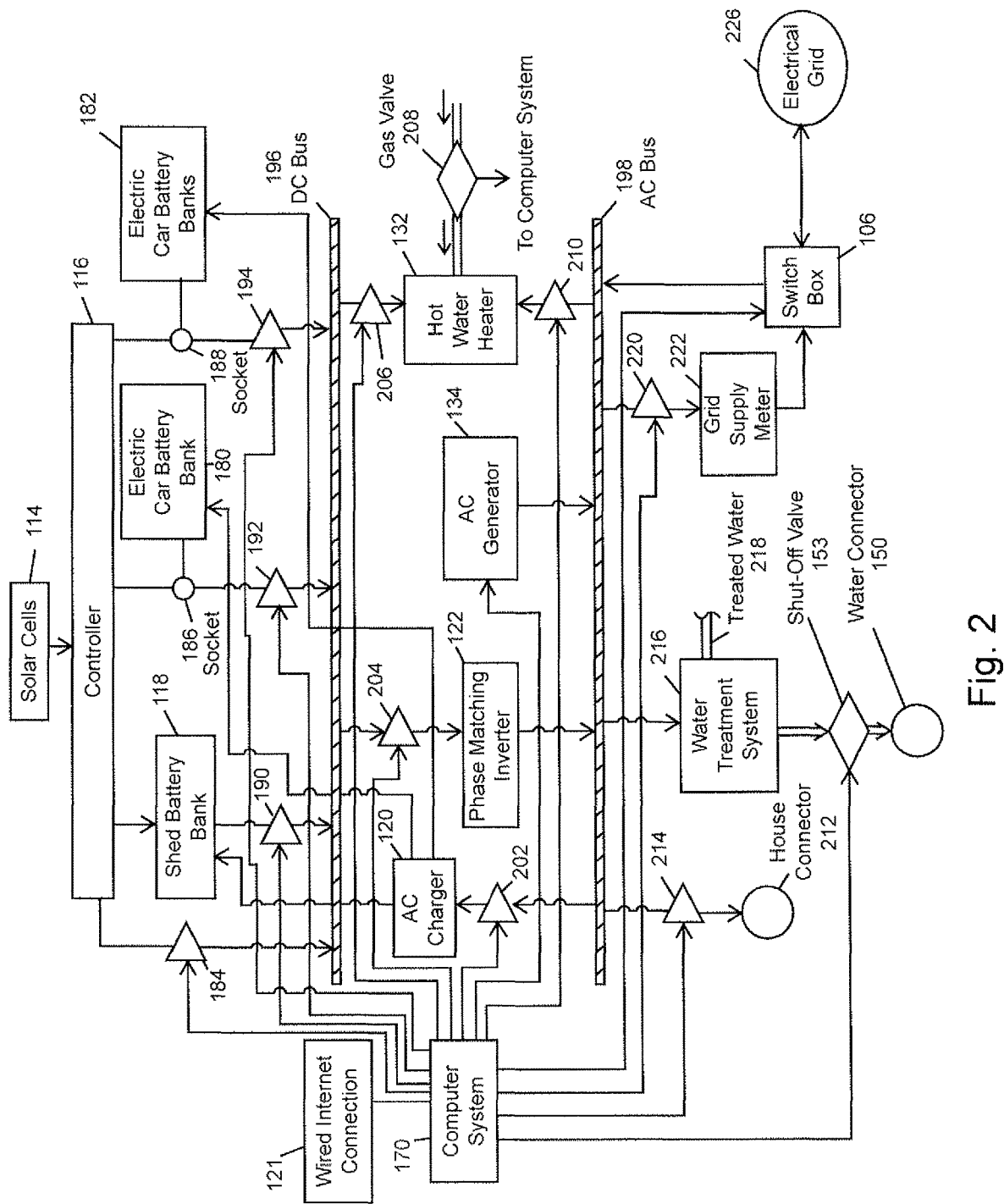
FIG. 2 is an electrical and plumbing schematic diagram of an embodiment of the present invention.

FIG. 2 is a schematic layout of the various components that may be included in the emergency shed 100. Again, all of these components may be included but a lesser combination of all these components may be included in the emergency shed 100. For example, in a standard model, an AC generator, such as AC generator 134, may not be included, as well as a hot water heater 132. Hook-ups for these devices may be included in the standard model so that the purchaser can purchase these items separately and include them after the purchase. In addition, various sizes of AC generators can be purchased for inclusion in the emergency shed 100. AC generators may run on propane gas or natural gas when a natural gas hook-up is available or on gasoline or diesel. In addition, an exterior propane tank can be purchased separately with a propane hook-up on the outside of the emergency shed 100 and piping to the various devices, such as the AC generator 134 and the hot water heater 132.

As illustrated in FIG. 2, the solar cells 114 are connected to a controller 116. The controller 116 may generate one or more voltage outputs that can be used for charging the shed battery bank 118, electric car battery bank 180 and/or additional electric car battery banks 182. Socket 186 comprises a hook-up for charging an electric car battery bank 180. Additional sockets, such as socket 188, can be provided for connecting additional electric ear battery banks, such as electric car battery banks 182. The shed battery bank 118 may comprise a 12 volt system. As such, controller 116 may produce a voltage of approximately 14.3 volts to charge the shed battery bank 118. The electric car battery banks 180, 182 may have a different, higher voltage. For example, electric car battery banks 180, 182 may be a 200-800 volt system. In that case, the controller 116 supplies a larger voltage to sockets 186, 188 to charge electric ear battery banks 180, 182. Switch 190 connects the shed battery bank 118 to the DC bus 196. The DC bus 196 may be a 12 volt DC bus or some higher voltage, such as a 24 volt DC bus or other voltage. Switch 190 may also include a converter, which converts the 12 volt output of the shed battery bank 118 to 24 volts, or any other higher DC voltage, to match the voltage of the DC bus 196. Switch 190 connects and disconnects the shed battery bank 118 to the DC bus 196 in response to a control signal from computer system 170. Similarly, switches 192, 194 connect the electric car battery banks 180, 182 to the DC bus 196. Again, switches 192, 194 may also include a simple converter circuit to convert the DC voltage of electric car battery banks 180, 182 to the DC voltage of the DC bus 196. Switches 192, 194 are individually connected or disconnected from the DC bus 196 in response to control signals from computer system 170.

As also shown in FIG. 2, switch 204 connects the inverter 122 to the DC bus 196. Inverter 122 receives the DC voltage signal from the DC bus 196 and generates an AC signal that is applied to AC bus 198. Inverter 122 is capable of detecting the phase of the AC signal on the AC bus 198 and generates an AC signal which matches the phase AC signal on the AC bus 198. When AC bus 198 is connected to electrical grid 226, the inverter 122 matches the phase of the AC grid signal. The inverter 122 can therefore be referred to as a phase-matching inverter. Switch 184 allows the controller 116 and solar cells 114 to be connected directly to the DC bus 196. In situations where it is not desired to have stored energy from shed battery bank 118 and electric car battery banks 180, 182, supplied to the electrical grid 226, solar cells can be used to directly supply DC power to the DC bus 196, which can be inverted by inverter 122 and supplied to the AC bus 198 and sent through the grid supply meter 222 to the electrical grid 226. For example, if shed battery bank 118, electric car battery bank 180 and electric car battery banks 182 are full and it is not desired to supply any of the stored energy from the battery banks 118, 180, 182 to the electrical grid 226, the solar cells 114 can continue to supply energy to the electrical grid 226 so that money can be recouped by solar cells 114.

As also shown in FIG. 2, switch 206 can connect and disconnect the DC bus 196 from the hot water heater 132. Switch 206 operates in response to a control signal from computer system 170. Hot water heater 132 may operate on DC voltage, AC voltage, propane or natural gas. The purchaser may select a hot water heater based upon the preferences of the user. Of course, if natural gas or propane gas is available, natural gas and propane gas provide the most efficient method of heating hot water. In addition, a purchaser (user) of the emergency shed 100 may simply wish to not have hot water available. However, if hot water is not available in the house as a result of a shutdown of utilities, including natural gas, a user may wish to have hot water available in the emergency shed 100 to wash clothes and dishes in a sink and have a small shower available for bathing. In that case, a water heater may be selected that runs from the DC bus 196, AC bus 198 or propane gas. Switch 210 is connected to the hot water heater 132 and supplies AC power from AC bus 198 to the hot water heater 132. Switch 210 connects and disconnects the AC power to the hot water heater 132 in response to a control signal from computer system 170. Gas valve 208 also operates in response to a control signal from computer system 170. Hot water heater 132 can also work on a combination of either natural or propane gas, and AC or DC electrical power. Refrigeration units are also available that operate in the same manner, i.e., on either electrical power or gas. As such, a refrigerator/freezer could also be provided in the emergency shed 100 to allow storage of refrigerated and frozen foods. With regard to the hot water heater 132, there may be an interruption of natural gas service to a house or other building associated with the emergency shed 100, which shuts off the heat and hot water in the house. In that case, a separate propane supply from a propane tank can provide gas to the hot water heater 132. In that instance, electric power can be provided to the house or other proximate building by house connector 212 to supply electric energy to the house or other building so that electric heaters can be placed in the house or other building to prevent frozen pipes. In that case, AC generator 134, which may operate on propane, can supply a large amount of AC power to the AC bus 198 when both the supply of natural gas and electrical grid power are not available. Refrigeration can also be maintained within the house to prevent the spoilage of food items. AC generator 134 operates in response to a control signal from computer system 170.

As also illustrated in FIG. 2, an AC charger 120 is connected to the AC bus 198 by switch 202. Switch 202 connects and disconnects the AC charger 120 from the AC bus 198 in response to a control signal from computer system 170. AC charger 120 operates on AC power and has a plurality of DC charging outputs that are connected to shed battery bank 118, electric car battery bank 180 and additional electric car battery banks 182. AC charger 120 may be a digital charger that is capable of quickly charging shed battery bank 118 and the electric car battery banks 180, 182. Digital chargers are capable of rapid charge of low batteries, as well as using various techniques for maintaining the battery charges. Each channel from the AC charger 120 separately regulates the charging of each of the battery banks 118, 180, 182.

As also illustrated in FIG. 2, switch 214 connects and disconnects the AC bus 198 to the house or other associated structure in response to a control signal from the computer system 170. The connection to the house is schematically illustrated as house connector 212. The connection to the house can be hardwired or a plug-in cable system can be used to connect the emergency shed 100 to the house or other structure. Switch 220 connects and disconnects the AC bus 198 to a grid supply meter 222 in response to a control signal from the computer system 170. Grid supply meter 222 measures the amount of current being supplied from the AC bus 198 to the electrical grid 226. Grid supply meter 222 is connected to a switch box 106. Switch box 106 is also connected to the AC bus 198 and supplies electrical grid power in the form of AC electrical power from the electrical grid 226 to the AC bus 198. When power is lost on the electrical grid 226, the switch box 106 disconnects the AC bus 198 from the electrical grid 226 so that power generated by the emergency shed 100 is disconnected from the electrical grid 226. This is necessary since utilities may intentionally turn off at least portions of the electrical grid 226, especially during emergency situations to prevent electrocutions. If electric power is being provided to the electrical grid 226 from the emergency shed 100 during a shutdown, electrocutions may still occur. As such, as a safety measure, a switch box 106 is required for disconnection of any electrical power source from the electrical grid 226. Switch box 106 can also be controlled by a control signal from the computer system 170 to disconnect the electrical system of the emergency shed 100 from the electrical grid 226. For example, the user of the emergency shed 100 may wish to be disconnected from the electrical grid 226 for various reasons, including saving money. Switch 220 and grid supply meter 222 can be used to supply electrical power from the emergency shed 100 to the electrical grid 226 during non-emergency periods so the emergency shed 100 can sell power back to the utility company and reduce the utility bill of the user and/or create credit for electric utilities. In this manner, the emergency shed 100 may pay for itself over a period of time.

As also illustrated in FIG. 2, a water treatment system 216 may be included in the emergency shed 100 to provide a supply of clean water during an emergency. Clean water is a necessity and can be in very short supply during an emergency situation. Municipal water and well water may be contaminated during certain emergency situations, such as floods. In that case, the contaminated water can be treated by the water treatment system 216 to provide a supply of treated water 218. Water connector 150 may obtain water from a municipal water supply, a well, or rainwater from the roof of the emergency shed 100. Shut-off valve 153 is opened and closed in response to a control signal from computer system 170. The treated water 218 is piped to a water tank 162 (FIG. 1), which maintains a supply of treated potable water. Water treatment system 216 can comprise any desired system, including a reverse osmosis system, a chlorine treatment system, a filtration system or any combination thereof For emergency shed use, a chlorine drip system may be the most economical but requires that the user continuously supply chlorine to the water treatment system 216. Various filters can be used to filter out the chlorine, such as carbon filters. Other filters may be used to filter spores and other contamination, such as heavy metal contamination, from the water.

A wired Internet connection 121 or wireless connection, illustrated in FIG. 2, can provide information to the computer system 170 to control the computer system 170. For example, an app on a smart phone can provide instructions to the computer system 170. The computer system 170 can store data and use that data to create control signals. Computing can also be performed on a smart phone using a smart phone application and instructions supplied via the Internet to the computer system 170. In addition, the computer system 170 may receive emergency alerts from the National Weather Service indicating that a weather emergency may be imminent in a particular geographical area. In that case, the computer system 170 may be programmed to take certain steps, such as ensuring that shed battery bank 118 and electric car battery banks 180, 182 are fast-charged by the AC charger 120. An example of utilizing an emergency warning from the National Weather Service is disclosed in FIG. 5.

As further illustrated in FIG. 2, separate control lines are shown to switches and other devices. FIG. 2 is intended to schematically illustrate the manner in which the operation of the systems of the emergency shed 100 occur. In application, each of the switches and other devices may be connected to a communication bus, which is connected to the computer system 170 that generates commands to different addresses for each of the switches and other devices illustrated in FIG. 2.

Figure 3:
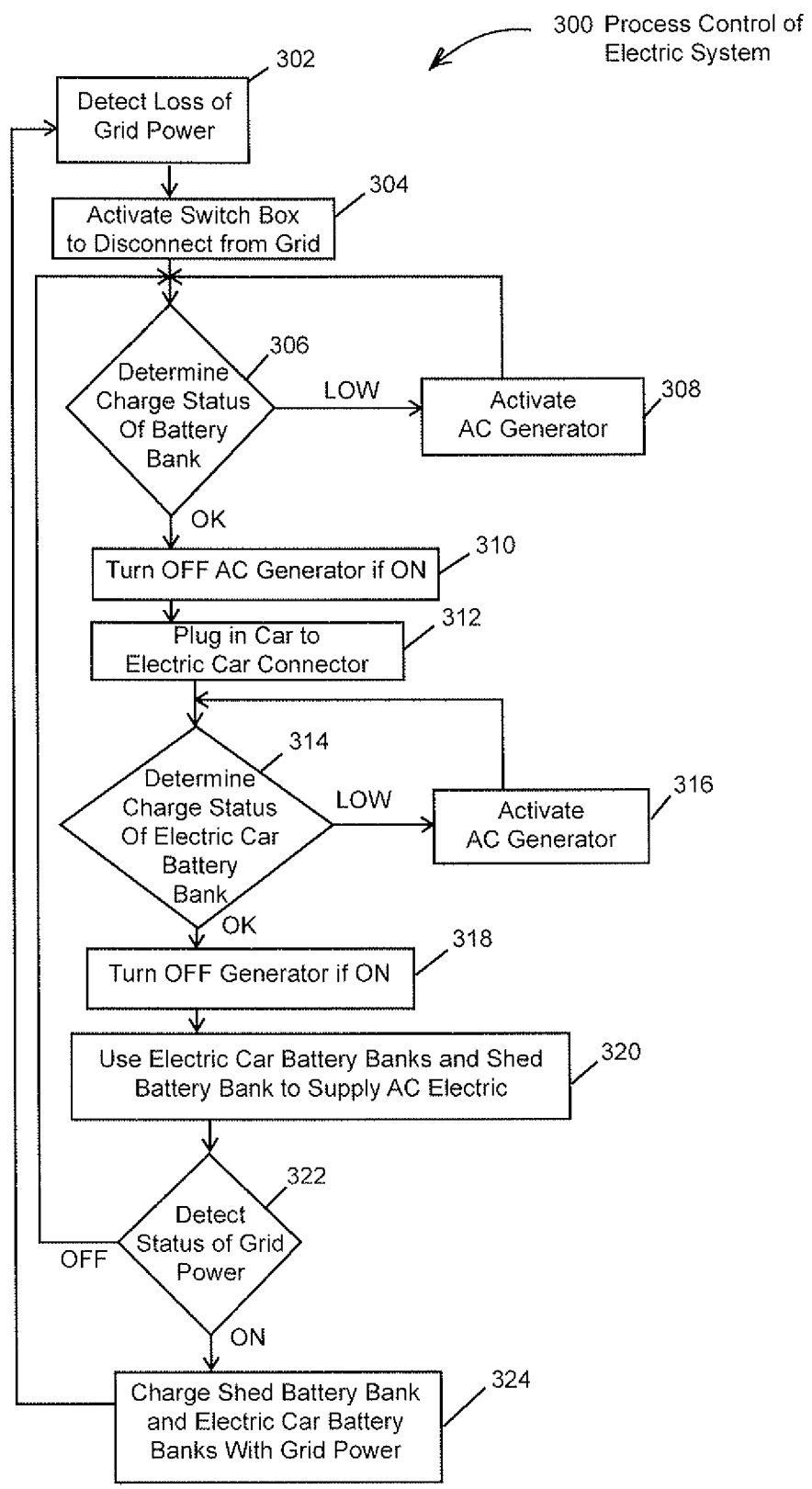
FIG. 3 is an embodiment for a flow diagram for process controlling the electrical system of an emergency shed.

FIG. 3 illustrates an embodiment of a process control 300 for controlling the electrical system of the emergency shed 100. As illustrated in FIG. 3, at step 302, a loss of electrical grid power is detected. At step 304, the switch box 224 (FIG. 2), is activated to disconnect the electrical system of the emergency shed 100 from the electrical grid 226. At step 306, the charge status of the shed battery bank 118 (FIG. 2) is checked. If the shed battery bank 118 has a charge that is lower than a preselected charge, the AC generator 134 is activated at step 308. The process then returns to step 306. If the charge status of the shed battery bank 118 is above a preselected charge, the process proceeds to step 310 and the AC generator 134 is turned off if it is on. At step 312, the user of the emergency shed 100 is messaged to instruct the user to plug an electric car into an electric car connector 146 (FIG. 1) on the emergency shed 100. Messaging may be done through an Internet connection. At step 314, the charge status of the electric car battery banks 180, 182 that are connected to the emergency shed 100 are checked to determine if the charge status is above a preselected level. If the charge status is below a preselected level, the AC generator 134 is activated at step 316. If the charge status of the electric car battery banks 180, 182 is above a preselected level, the AC generator 134 is turned off, if it is on. At step 320, the shed battery bank 118 and the electric car battery banks 180, 182 can remain connected to the DC bus 196 (FIG. 2) and supply power to the DC bus 196 so that inverter 122 can generate AC electric power and the stored power of the electric car battery banks 180, 182 and shed battery bank 118. At step 322, the status of the electrical grid power is detected. If the electrical grid power is still off, the process returns to step 306. If the electrical grid power is on, the process proceeds to step 324. At step 324, the shed battery bank 118 and electric car battery banks 180, 182 are charged using either the solar cells 114 or the AC charger 120 with electrical grid power. The process then returns to step 302.

Figure 4:
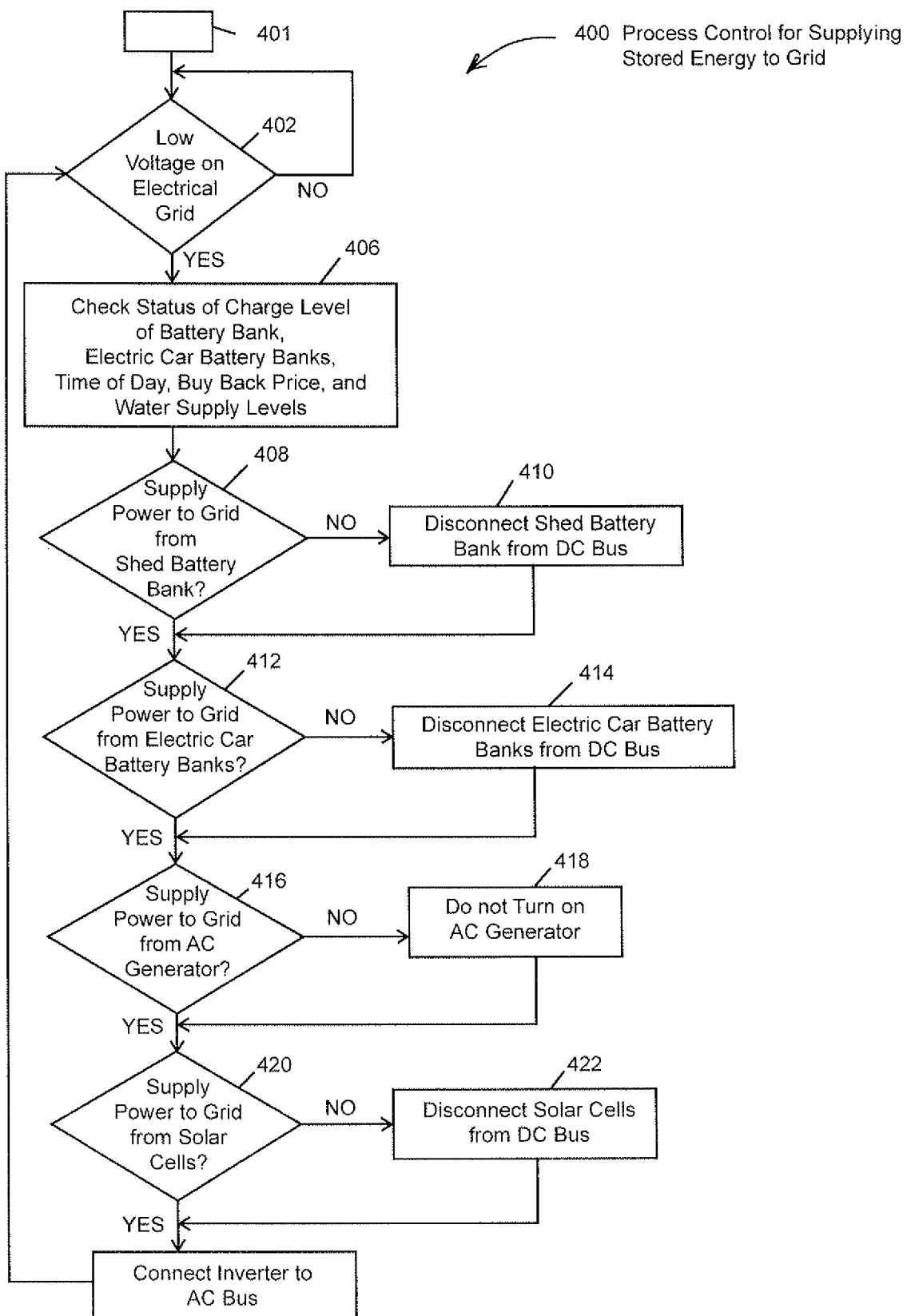
FIG. 4 is an embodiment of a flow diagram illustrating a process for utilizing the electrical system of the emergency shed to supply electric power to the electrical grid.

FIG. 4 is one embodiment of a process control 400 for supplying power from the emergency shed 100 to the electrical grid 226. The process starts at step 401. At step 402, it is determined if the voltage on the electrical grid 226 is a low voltage. For example, the electrical grid 226 may supply 117 volts RMS of AC electrical energy. If the voltage level dips below a preselected level, for example, 100 volts RMS, it is determined that a low voltage exists on the electrical grid 226. If a low voltage does not exist, the process returns to the start 401. If a low voltage does exist, various items are checked by the computer system 170. At step 406, the status of the charge level of the shed battery bank 118 and the one or more electric car battery banks 180, 182 is checked. The time of day can be checked to determine if a peak demand period currently exists, and the water supply level of the water tank 162 is above a preselected level. If any one of these items is below a preselected level, some may be disconnected from the DC bus 196. For example, in step 408, it is determined whether power should be supplied to the electrical grid 226 from the shed battery bank 118. If the shed battery bank 118 is below a preselected level, the shed battery bank 118 is disconnected from the DC bus 196 at step 410. If the shed battery bank 118 is above a preselected level, it is determined whether the first electric car battery bank 180 is above a preselected charge level. If not, the first electric car battery bank 180 is disconnected from the DC bus 196 at step 414. This process can be repeated for each of the electric car battery banks connected to the electrical system of the emergency shed 100. The process then proceeds to determine whether power should be supplied to the electrical grid 226 from the AC generator 134. For example, the cost of generating electrical energy using the AC generator 134 may be greater than the buyback amount provided by the municipality, even during peak demand periods. This information can be provided via the Internet. Normally, it is more costly to generate electrical energy using a local generator than the electricity supplied by the municipality, even during peak demand periods. However, some municipalities may adjust the buy-back price during peak demand periods or other periods to make the generation of electrical power economical. In that case, the AC generator 134 is turned on at step 416. At step 420, it is determined whether power should be supplied to the electrical grid 226 directly from the controller 116 and solar cells 114. Again, this may depend upon the charge level of the various battery banks and the weather. If not, the solar cells 114 and controller 116 are disconnected from the DC bus 196 via switch 184. If the solar cells 114 are to be used to supply energy to the electrical grid 226, switch 184 connects the controller 116 to the DC bus 196. At step 424, the inverter 122 is connected to the AC bus 198. The process then returns to step 402.

Figure 5:
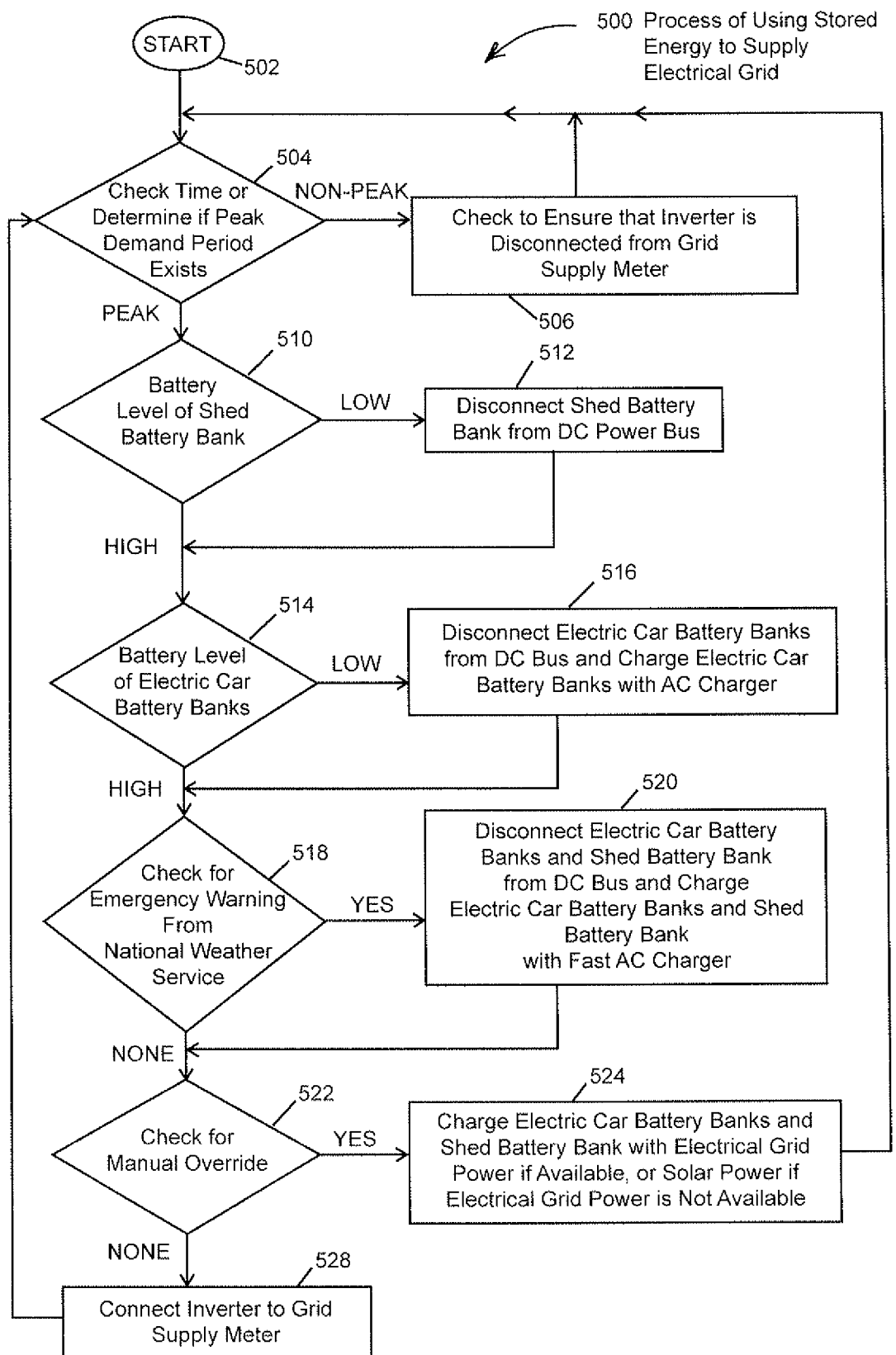
FIG. 5 is an embodiment of a process of supplying stored energy to the electrical grid.

FIG. 5 illustrates a process 500 of using stored energy to supply the electrical grid 226 (FIG. 2) The process starts at step 502. At step 504, the current time is determined. The current time may be supplied by the Internet or a local clock may be used in computer system 170. Alternatively, the computer system 170 can access the Internet to determine if a peak demand period exists. At step 506, if it is determined that a non-peak demand period exists, the inverter 122 is disconnected from the grid supply meter 222. The process then returns to step 504. Alternatively, if it is determined at step 504 that a peak demand period currently exists, the process proceeds to step 510. At step 504, the system may simply check the utility buy-back rate through an Internet connection to determine if the utility buy-back rate is above a preselected level. That preselected level may be programmed by the user, who selects a predetermined buy-back rate at which the user would like to sell electric power back to the municipal electric system. At step 510, the charge level of the shed battery bank 118 is determined. If the shed battery bank 118 is not above a preselected level, the shed battery bank 118 is disconnected from the DC power bus 196 at step 512. At step 514, the charge level of one or more electric car battery banks 180, 182 is checked. If the charge level of any of the electric car battery banks 180, 182 is below a preselected level, the electric car battery banks 180, 182 that are below the preselected level are disconnected from the DC bus 196 at step 516. It is then determined if the disconnected electric car battery banks are to be charged by the AC charger 120 in accordance with FIG. 7. At step 518, the system checks for the existence of an emergency warning from the National Weather Service. Computer system 170 (FIG. 2) can check via the Internet to determine if an emergency warning has been issued in the geographical area where the emergency shed 100 is located. If an emergency warning has been issued in the geographical area of the emergency shed 100, all of the electric car battery banks 180, 182 and the shed battery bank 118 are disconnected from the DC bus 196 and the AC charger 120 is used to charge the electric car battery banks 180, 182 and shed battery bank 118 at step 520. If AC power from the electrical grid 226 is still available, the AC power from the electrical grid 226 should be used to charge all of the battery banks 118, 180, 182. If AC power from the electrical grid 226 is not available, the AC generator 134 may be turned on to charge the electric car battery banks 180, 182 and shed battery bank 118. If no emergency warning has been issued, the process proceeds to step 522 where the computer system 170 checks to determine if a manual override exists, which prevents the use of stored energy to supply the electrical grid 226. If a manual override does exist, the electric car battery banks 180, 182 and the shed battery bank 118 are charged with electrical grid power, if electrical grid power is available, or solar power of AC charger 120 if no electrical grid power is available at step 524. The process then returns to step 504. At step 528, if no manual override exists in step 522, the inverter 122 is connected to the DC bus 196 via switch 204 and the grid supply meter 222 is connected to the AC bus 198 via switch 220.

Figure 6:
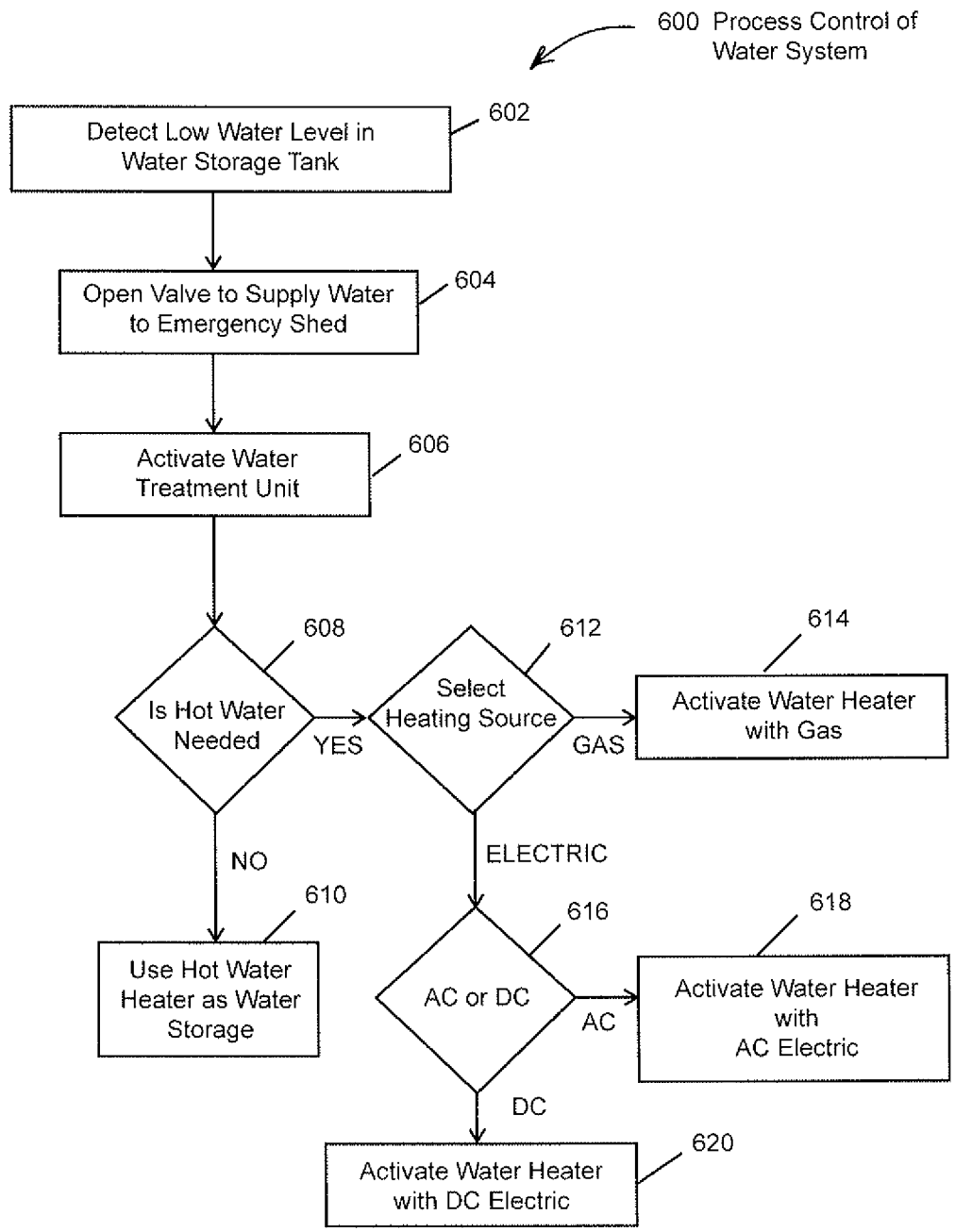
FIG. 6 is an embodiment of a process for controlling the water system of the emergency shed.

FIG. 6 is a schematic flow diagram illustrating an embodiment of the process control 600 of the water system of the emergency shed 100. At step 602, the water level in the water storage tank 162 is detected. If it is low, shut-off valve 153 is opened to supply water to the water system at step 604. Again, water can be provided from a municipal water system, a well, or rainwater from the roof of the emergency shed 100. Again, a well or municipal water system may be contaminated, which requires treatment by the water system prior to the water being delivered to the water storage tank 162. When the shut-off valve 153 is opened at step 604, the water treatment unit is activated at step 606. The process proceeds to step 608, where it is determined if hot water is needed. If not, the water heater 132 can be used as water storage at step 610. If hot water is needed, the process proceeds to step 612, where the computer system 170 selects the heating source for the water heater 132. If gas is selected, the process proceeds to step 614 and the water heater 132 is activated with a supply of gas, i.e., either natural gas or propane. If the heating source is selected at step 612 as electric, the process proceeds to step 616 to determine if AC or DC electric power should be used to heat the hot water. If AC is selected, the AC electric system is activated via switch 210 for the water heater 132 at step 618. If DC is selected, the water heater 132 is activated with DC electric via switch 206 at step 620.

Figure 7:
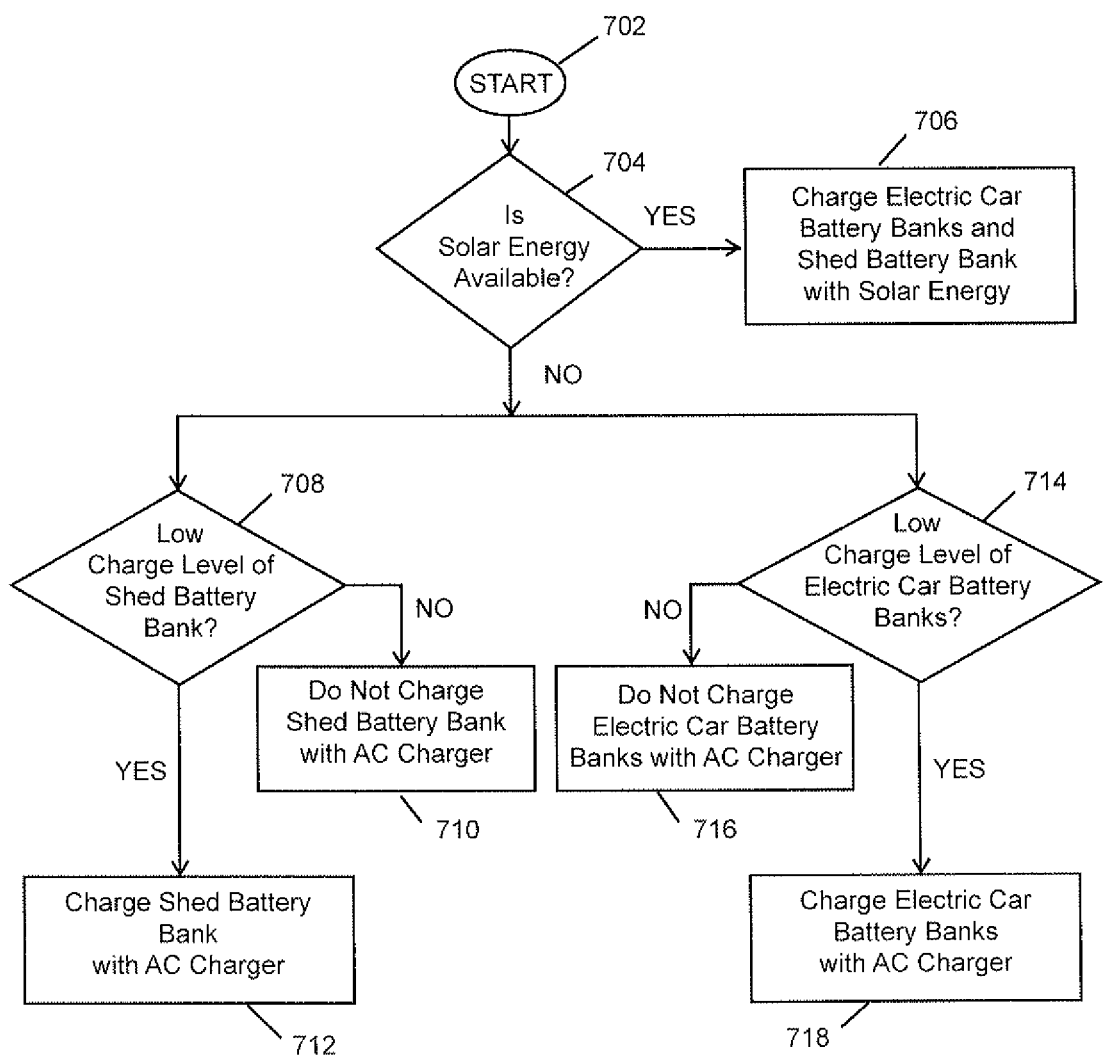
FIG. 7 is an embodiment of a process for charging batteries with an AC charger.

FIG. 7 is a schematic flow diagram of one embodiment of a process 700 for charging batteries with an AC charger 120 (FIG. 2). The process starts at step 702. At step 704, it is determined whether solar power is available. This is done by detecting the voltage level at the output of the solar cells 114. If solar energy is available, the process proceeds to step 706, where the electric car battery banks 180, 182 and shed battery bank 118 can be charged with solar energy. If solar energy is not available, the process proceeds to step 708, where it is determined if the charge level is low on the shed battery bank 118. If the charge level is low on the shed battery bank 118, the shed battery bank 118 is charged with the AC charger 120 at step 712. If the charge level on the shed battery bank 118 is not low, the shed battery bank 118 is not charged with the AC charger 120 at step 710. At step 714, it is determined whether the charge level of any of the electric car battery banks 180, 182 is low. If any of the electric car battery banks 180, 182 have a low charge level, the electric car battery banks 180, 182 having the low charge level are charged with the AC charger 120 at step 718. If the charge level on any of the electric car battery banks 180, 182 of the one or more electric car battery banks are not below a preselected level, the AC charger 120 is not used to charge any of the electric car battery banks 180, 182.

Consequently, the emergency shed 100 provides an all-in-one system that can provide both potable drinking water and electrical power during emergency situations. The emergency shed 100 can also supply a source of hot water, including a shower and sinks for cleaning dishes and other items. During non-emergency times, the emergency shed 100 can supply stored power to the electrical grid 226. For example, the shed battery bank 118, as well as one or more electric car battery banks 180, 182, can be charged during off-peak power periods, when demand is low and electric power is inexpensive. The stored electrical energy can then be supplied to the electrical grid 226 through a grid supply meter 222, which detects and provides a reading of the amount of power supplied from the emergency shed 100 to the electrical grid 226 during peak demand periods, when energy is purchased back from the user at a much higher rate than the off-peak demand periods. in addition, the charge provided by the solar cells 114 is also accumulated in the shed battery bank 118 and electric car battery banks 180, 182. In this manner, the emergency shed 100 can function as an income generator to offset the price of utilities and help to pay back the cost of the emergency shed 100. Since the electric car battery banks 180, 182 can store a large amount of electrical energy, the amount of electrical energy that can be supplied back to the electrical grid 226 during peak demand periods can be substantial so the return on investment on the emergency shed 100 can be rapid.

Other forms of renewable energy can also be connected to the emergency shed 100, including wind turbines. A separate wind turbine can be purchased and connected to the emergency shed 100 to further assist in the use of renewable energy. However, the quickest return on investment is to charge the shed battery bank 118, as well as the electric car battery banks 180, 182, during off-peak demand periods and reselling the energy to the municipality during peak demand periods. The connection of the computer system 170 to the Internet allows the systems of the emergency shed 100 to be programmed as desired. Of course, the computer system 170 is preprogrammed to perform all of the basic functions of the emergency shed 100, as disclosed above, which can be modified, as desired by the user through an app on a smart phone.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method of providing electrical power using an emergency shed comprising:
   connecting an AC electrical system of said emergency shed to an electrical grid that supplies AC electrical grid power to said AC electrical system of said emergency shed;
   connecting at least one electric car, having at least one electric car battery bank, to a DC electrical system of said emergency shed;
   connecting a shed battery bank to said DC electrical system of said emergency shed;
   collecting solar energy with solar cells mounted on said emergency shed to create solar cell electrical power;
   applying said solar cell electrical power to a controller that generates one or more voltage levels from said solar cell electrical power;
   applying a first voltage level, of said one or more voltage levels, to said shed battery bank to charge said shed battery bank;
   applying a second voltage level, of said one or more voltage levels, to said at least one electric car battery bank to charge said at least one electric car battery bank;
   determining if electrical power should be supplied to said electrical grid from said emergency shed;
   connecting said shed battery bank to said DC electrical system if electrical power from said shed battery bank is to be applied to said electrical grid;
   connecting said at least one electric car battery bank to said electrical grid if electrical power from said at least one electric car battery bank is to be applied to said electrical grid;
   connecting an inverter to said DC electrical system when electrical power from said DC electrical system is to be supplied to said electrical grid;
   inverting DC electrical power from said DC electrical system to AC electrical power using said inverter;
   connecting said AC electrical system to a grid supply meter to detect an amount of AC electrical power that is supplied to said electrical grid from said emergency shed;
   detecting a loss of electrical power from said electrical grid;
   activating a switch box to disconnect said AC electrical system of said emergency shed from said electrical grid;
   activating an electric generator if charge levels of said shed battery bank or said at least one electric car battery bank are below a preselected level;
   deactivating said switch box to connect said AC electrical system of said emergency shed to said electrical grid when electrical power is detected on said electrical grid;
   deactivating said electric generator when electric power is detected on said electrical grid and said switch box has been deactivated.

2. The method of claim 1 wherein the method of determining if electrical power should be supplied to said electrical grid from said emergency shed comprises:
   checking a charge level of said shed battery bank;
   not supplying electrical power from said shed battery bank when said charge level of said shed battery bank is below a first selected level;
   checking a charge level of said at least one electric car battery bank;
   not supplying electrical power from said at least one electric car battery bank when said charge level of said at least one electric car battery bank is below a second selected level;
   checking to determine if a manual override has been placed on supplying electrical power from said emergency shed to said electrical grid;
   not supplying electrical power from said emergency shed to said electrical grid when a manual override is in place;
   checking to determine if a peak demand period currently exists;
   not supplying electrical power if a peak demand period does not currently exist.

3. The method of claim 2 wherein said methods of inverting DC power from said shed battery bank and inverting DC power from said at least one electric car battery bank comprise:
   using a phase matching inverter.

4. The method of claim 1 further comprising:
   detecting when said solar energy electrical power is not available;
   checking charge levels of said shed battery bank and said electric car battery bank;
   activating an AC charger connected to said AC electrical system to charge said shed battery bank when said shed battery bank has a charge level that is below a first preselected charge level and to charge said at least one electric car battery bank when said at least one electric car battery bank has a charge level that is below a second preselected charge level.

5. An emergency shed for supplying electricity and potable drinking water during emergencies and for supplying electrical power to the electrical grid during peak demand periods comprising:
   solar cells mounted on said emergency shed that supply solar energy as DC electrical power;
   a controller connected to said solar cells that generates at least two DC voltages;
   a DC electrical system disposed in said emergency shed;

a shed battery bank connected to said DC electrical system so that a first DC voltage, of said at least two DC voltages, from said controller charges said shed battery bank;
at least one electric car battery bank connected to said DC electrical system and to said controller so that a second DC voltage, of said at least two DC voltages from said controller, charges said electric car battery bank;
an AC electrical system disposed in said emergency shed that is connected to said electrical grid;
a switch box connected to said AC electrical system and said electrical grid that disconnects said AC electrical system from said electrical grid when power is not present on said electrical grid;
an inverter connected to said DC electrical system that supplies AC electrical power from said DC electrical system to said AC electrical system;
a house connector that connects said AC electrical system to a house or other building proximate to said emergency shed;
a grid supply meter connected to said AC electrical system and to said electrical grid that detects an amount of AC electrical power applied to said electrical grid from said AC electrical system;
a charger connected to said AC electrical system that charges said shed battery bank and said at least one electric car battery bank in response to a charger control signal;
an AC generator that is connected to said AC electrical system that generates AC power on said AC electrical system in response to an AC generator control signal;
a water treatment system that treats a source of water to produce potable drinking water;
a first plurality of switches that connects and disconnects said shed battery bank, said at least one electric car battery bank and said inverter to said DC electrical system in response to first switch control signals;
a second plurality of switches that connects and disconnects said charger, said grid supply meter and said house connector to said AC electrical system in response to second switch control signals;
a computer system that generates said charger control signal, said AC generator control signal, said first switch signals and said second switch control signals to control operation of said emergency shed to supply electricity and potable drinking water during emergencies and supply electricity to said electrical grid during non-emergencies and peak demand periods.

6. The emergency shed of claim 5 wherein said water treatment system comprises a chlorine system and a series of filters.

7. The emergency shed of claim 5 wherein said water treatment system comprises a reverse osmosis system.

8. The emergency shed of claim 5 wherein said inverter is a phase matching inverter.

9. The emergency shed of claim 5 further comprising;
a hot water heater that is powered by electrical power or gas.

10. The emergency shed of claim 5 wherein said charger is a digital charger that operates using AC electrical power.

11. The emergency shed of claim 5 wherein said AC generator is a gas generator.

12. A method of providing electrical power using an emergency shed comprising:
connecting an AC electrical system of said emergency shed to an electrical grid that supplies electrical grid power to said electrical system of said emergency shed;
connecting at least one electric car, having at least one electric car battery bank, to a DC electrical system of said emergency shed;
connecting a shed battery bank to said DC electrical system of said emergency shed;
collecting solar energy with solar cells mounted on said emergency shed to create solar cell electrical power;
applying said solar cell electrical power to a controller that generates one or more voltage levels from said solar cell electrical power;
applying a first voltage level, of said one or more voltage levels, to said shed battery bank to charge said shed battery bank;
applying a second voltage, of said one or more voltage levels, to said at least one electric car battery bank to charge said at least one electric car battery bank;
determining if electrical power should be supplied to said electrical grid from said emergency shed;
connecting said shed battery bank to said DC electrical system if electrical power from said shed battery bank is to be applied to said electrical grid;
connecting said at least one electric car battery bank to said electrical grid if electrical power from said at least one electric car battery bank is to be applied to said electrical grid;
connecting an inverter to said DC electrical system when electrical power from said DC electrical system is to be supplied to said electrical grid;
inverting DC electrical power from said DC electrical system to AC electrical power using said inverter;
connecting said AC electrical system to a grid supply meter to detect an amount of AC electrical power that is supplied to said electrical grid from said emergency shed;
periodically checking a water level of a water storage tank in said emergency shed;
activating a water purification system if said water level of said water storage tank is below a preselected level.

* * * * *